(12) United States Patent
Soussan et al.

(10) Patent No.: US 11,282,702 B2
(45) Date of Patent: Mar. 22, 2022

(54) METHOD OF FORMING A SEMICONDUCTOR DEVICE STRUCTURE

(71) Applicants: IMEC VZW, Leuven (BE); KATHOLIEKE UNIVERSITEIT LEUVEN, Leuven (BE)

(72) Inventors: Philippe Soussan, Wavre (BE); Vasyl Motsnyi, Leuven (BE); Luc Haspeslagh, Lubbeek (BE); Stefano Guerrieri, Kessel-lo (BE); Olga Syshchyk, Leuven (BE); Bernardette Kunert, Wilsele (BE); Robert Langer, Leuven (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 17/068,785

(22) Filed: Oct. 12, 2020

(65) Prior Publication Data
US 2021/0111021 A1    Apr. 15, 2021

(30) Foreign Application Priority Data
Oct. 11, 2019    (EP) .................................... 19202647

(51) Int. Cl.
*H01L 27/00* (2006.01)
*H01L 21/02* (2006.01)
*H01L 29/66* (2006.01)

(52) U.S. Cl.
CPC .. *H01L 21/02387* (2013.01); *H01L 29/66121* (2013.01); *H01L 29/66204* (2013.01)

(58) Field of Classification Search
None
See application file for complete search history.

(56) References Cited

U.S. PATENT DOCUMENTS

| 2006/0006404 | A1 | 1/2006 | Ibbetson et al. |
| 2008/0173875 | A1* | 7/2008 | Koshka ............. H01L 29/66068 257/77 |
| 2015/0221546 | A1 | 8/2015 | Lochtefeld |

OTHER PUBLICATIONS

Munck et al., "High performance Hybrid and Monolithic Backside Thinned CMOS Imagers realized using a new integration process", Electron Device Meeting, IEDM '06, International, IEEE, PI, XP031078408, Dec. 1, 2006.
Keyvaninia et al., "Ultra-thin DVS-BCB adhesive bonding of III-V wafers, dies and multiple dies to a patterned silicon-on-insulator substrate", 1Photonics Research Group, Ghent University-imec, Sint-Pietersnieuwstraat 41, B-9000 Ghent, Belgium, Optical Materials Express, vol. 3, No. 1, Jan. 1, 2013.
(Continued)

*Primary Examiner* — Reema Patel
(74) *Attorney, Agent, or Firm* — Moser Taboada

(57) ABSTRACT

The present invent provides a method comprising forming a first wafer comprising a first substrate of a group IV semiconductor, and a group III-V semiconductor device structure formed by selective area epitaxial growth on a surface portion of a front side of the first substrate. The method further comprises forming a second wafer comprising a second substrate of a group IV semiconductor, and a group IV semiconductor device structure formed on a front side of the second substrate, and bonding the first wafer to the second wafer with the front side of the first substrate facing the front side of the second wafer.

11 Claims, 7 Drawing Sheets

(56) References Cited

OTHER PUBLICATIONS

Luo et al., "High-throughput multiple dies-to-wafer bonding technology and III/V-on-Si hybrid lasers for heterogeneous integration of optoelectronic integrated circuits", Institute of Microelectronics, Agency for Science, Technology and Research (A*STAR), Singapore, Singapore, DOI: 10.3389/fmats.2015.00028, Apr. 7, 2015.

Kunert et al., "Integration of III/V Hetero-Structures by Selective Area Growth on Si for Nano- and Optoelectronics", Imec, Kapeldreef 75, 3001 Leuven, Belgium, ECS Transactions, 75 (8), 409-419, 2016.

Thomson et al., "Roadmap on silicon photonics", IOP Publishing, Journal Optics, Optoelectronics Research Centre, University of Southampton, Southampton, SO17 1BJ, UK, doi:10.1088/2040-8978/18/7/073003, Jun. 24, 2016.

Kunert et al., "III/V nano ridge structures for optical applications on patterned 300 mm silicon substrate", imec, Kapeldreef 75, 3001 Heverlee, Belgium, http://dx.doi.org/10.1063/1.4961936, Aug. 29, 2016.

Arik Sebastian Jung, "SiGe/Si Epitaxy and Wafer Bonding Applied to X-ray Detectors", Doctor of Sciences of ETH Zurich, Diss. ETH No. 25044, 2018.

Dragoi et al., "Direct Wafer Bonding of GaN for Power Devices Applications", EV Group, 4782—Sankt Florian am Inn, Austria, The Electrochemical Society, ECS Transactions, 86 (5), 23-29, 2018.

Extended European Search Report on Application No. EP 19202647.4, dated Mar. 18, 2020.

\* cited by examiner

METHOD OF FORMING A SEMICONDUCTOR DEVICE STRUCTURE

CROSS-REFERENCE TO RELATED APPLICATIONS

This application claims priority to European Patent Application No. 19202647.4 filed on Oct. 11, 2019, herein incorporated by reference in its entirety.

TECHNICAL FIELD

The present inventive concept relates to the field of forming semiconductor devices.

More particularly it relates to a method of integrating semiconductor materials of group III-V into group III semiconductor manufacturing.

BACKGROUND

Semiconductor materials of group III-V are alloys that contain elements from groups II and V of the periodic table, such as InP, InAs, GaAs, GaN, and InSb. They are for example widely used in optoelectronic devices due to their electronic properties, such as high electron mobility, direct band gap and low exciton binding energy. III-V materials may for example be used in PIN diodes that are implemented in Short-wavelength infrared (SWIR) imagers. However, SWIR imagers are usually made with wide band-gap materials that need to be bonded at die level with micro bumps and may further be associated with large costs.

Unfortunately, direct growth of III-V materials, like e.g. GaAs, on standard Si (001) remains an integration process challenge and impacts significantly on device performance. This is due to the significant lattice mismatch and difference in the thermal expansion coefficients between e.g. GaAs and Si, of 4% and 60%, respectively. Moreover, direct nucleation of GaAs on Si poses the threat of undesirable antiphase domain formation.

Consequently, semiconductor materials of group III-V may be difficult to grow on group III semiconductors, such as Si, and their processability and co-integration with e.g. Si Complementary metal-oxide-semiconductor (CMOS) technology is limited due to e.g. mismatch in thermal expansion (CTE) of die-bonded wafers.

Thus, there is a need in the art for improved methods of integrating III-V materials, such as III-V PIN diodes, into a CMOS manufacturing line.

SUMMARY

It is an object of the invention to at least partly overcome one or more limitations of the prior art. In particular, it is an object to provide an improved method of bonding a wafer with a III-V material to a wafer with a group IV semiconductor.

As a first aspect of the invention, there is provided a method comprising:
  forming a first wafer comprising a first substrate of a group IV semiconductor, and a group III-V semiconductor device structure formed by selective area epitaxial growth on a surface portion of a front side of the first substrate,
  forming a second wafer comprising a second substrate of a group IV semiconductor, and a group IV semiconductor device structure formed on a front side of the second substrate, and
  bonding the first wafer to the second wafer with the front side of the first substrate facing the front side of the second wafer.

The first aspect provides an improved approach for integrating a group III-V semiconductor device structure into a group IV semiconductor manufacturing line. The inventors have found that the first wafer as formed according to the method may conveniently be bonded to the second wafer using conventional chip stacking techniques, such as wafer to wafer bonding. Using the method of the first aspect of the invention, the CTE mismatch between the substrates may be reduced. This allows for the production of e.g. SWIR imagers made with a wide band gap material in a CMOS production line.

Thus, in embodiments of the first aspect, there is substantially no mismatch in thermal expansion coefficient (CTE) between the first and second substrates when bonding the first wafer to the second wafer.

Forming of the first wafer may comprise forming the III-v semiconductor structure directly on silicon using heteroepitaxy.

The group IV semiconductor device formed on the second substrate may comprise a CMOS based sensor and/or a readout circuit.

The group III-V semiconductors referred to herein may be selected from InP, InGaAs, InAs, GaAs, AlAs, GaSb, AlSb, InSb, GaP, AlP, BAs, BP, BSb, GaN, AlN, InN, GaAsSb and ternary and quaternary combinations thereof.

Further, the group IV semiconductor referred to herein may be chosen from Si, Ge, SiGe, SnGe or SnSi.

In embodiments of the first aspect, the first substrate is a silicon substrate and/or the second substrate is a silicon substrate.

Thus, only the first substrate may be a silicon substrate or only the second substrate may be a silicon substrate. As an alternative, both substrates may be silicon substrates.

In embodiments of the first aspect, forming the first wafer comprises:
  forming an insulating layer on the front side of the first substrate, the surface portion of the first substrate being exposed by a trench in the insulating layer, and
  thereafter epitaxially growing the group III-V semiconductor device structure on the surface portion exposed by the trench.

Thus, the formation of the first layer may comprise epitaxially growing the group III-V semiconductor device structure in trenches in the insulating layer on the first side of the first substrate. The growth may hence be formed by a dislocation trapping technique.

As an example, forming the III-V semiconductor device structure formed by selective area epitaxial growth on a surface portion of a front side of the first substrate may be by Aspect Ratio Trapping (ART). This may reduce the terminating defects at the sidewalls of the patterned trenches that enclose the growth region.

Thus, the ART technique allows trapping of dislocations originating from differences in lattice constant of the III-V semiconductor material and the group IV semiconductor. Accordingly, the trenches may be formed as a high aspect ratio aperture (i.e. having a vertical height greater than a width).

As an example, forming the group III-V semiconductor device structure may comprise growing a lower narrow portion in the trench and an upper wider portion protruding above the trench.

As an example, the group III-V semiconductor device structure forms a photodiode structure comprising a lower diode portion of a first conductive type extending from the surface portion and protruding above the trench, and an upper diode portion of a second conductivity type opposite to the first conductivity type.

As an example, the photodiode structure may further comprise an intrinsic portion between the lower and upper diode portions.

The method may thus be used for the formation of photodiode structures on the first wafer and integrating these structures with the second wafer, such as integrating the diode structures with a CMOS based second wafer. As an example, the method may be for formation of photodiodes having a sensitivity for wavelengths that are between 0.3-2.5 µm, such as between 0.4 to 2 µm, such as between 0.4-1.6 µm.

Consequently, the method of the first aspect is advantageous in that it may provide a sensor for detecting wavelengths between 0.3-2.5 µm, such as between 0.4 to 2 µm, such as between 0.4-1.6 µm, using a single chip only, instead of using two different wafers manufactured using two different platforms.

The shape of the protruding first portion may be selected so as to decrease leakage current.

As an example, the width of at least one trench in the insulating layer is between 60-100 nm, such as between 70-90 nm.

The inventors have found that by having the width of at least one trench, such as the width of all trenches, between 60-100 nm, such as between 70-90 nm, properties such as dark current and low defect density may be achieved.

As a further example, the bottom of at least one trench may have the form of an inverted pyramid. This may be advantageous in that it may increase the amount of internal reflection and therefore also increase the quantum efficiency of the device.

In embodiments of the first aspect, the first wafer comprises a set of group III-V semiconductor photodiode structures, each photodiode structure formed by selective area growth on respective surface portions of the front side of the first substrate exposed by a respective trench in an insulating layer formed on the front side of the first substrate, and each photodiode structure comprising a lower diode portion of a first conductive type extending from the respective surface portion and protruding above the trench, and an upper diode portion of a second conductivity type opposite to the first conductivity type, and wherein the photodiode structures are formed to merge above the trenches.

In embodiments of the first aspect, bonding the first wafer to the second wafer with the front side of the first substrate facing the front side of the second wafer is performed without any additional patterning of the front side of the first substrate after selective area epitaxial growth on a surface portion of a front side of the first substrate Furthermore, in embodiments of the first aspect, the group IV semiconductor device structure formed on a front side of the second substrate is configured such that the second substrate is an active substrate.

The group IV semiconductor device structure may be a CMOS structure and/or comprise read-out circuitry.

In embodiments of the first aspect, the method is further comprising, subsequent to said bonding, removing the first substrate to expose a base portion of the group III-V semiconductor structure and forming electrical connections to said base portions. This step may for example be performed if a front illuminated sensor or a CMOS readout integrated circuit (ROIC) is produced by the method of the first aspect.

In embodiments of the first aspect, the method is further comprising, subsequent to said bonding, thinning of said second substrate and forming electrical connections to said group IV semiconductor device structure. This step may for example be performed if a back illuminated module sensor for VIS and SWIR is produced by the method of the first aspect.

According to some embodiments, the first and/or second handling wafer may have a wafer size of at least 300 mm.

As a second aspect of the invention, there is provided a method for forming a diode structure on a wafer, said method comprising forming an insulating layer on the front side of the first substrate, the surface portion of the first substrate being exposed by a trench in the insulating layer, and thereafter epitaxially growing a group III-V semiconductor diode structure on the surface portion exposed by the trench, wherein the trench has a width that is between 60-100 nm, such as between 70-90 nm.

The second aspect may be for formation of photodiodes having a sensitivity for wavelengths that are between 0.3-2.5 µm, such as between 0.4 to 2 µm, such as between 0.4-1.6 µm.

This aspect may generally present the same or corresponding advantages as the former aspect. Effects and features of this second aspect are largely analogous to those described above in connection with the first and second aspects. Embodiments mentioned in relation to the first aspects are largely compatible with the second aspect.

In an embodiment of the second aspect, the group III-V semiconductor device structure forms a photodiode structure comprising a lower diode portion of a first conductive type extending from the surface portion and protruding above the trench, and an upper diode portion of a second conductivity type opposite to the first conductivity type.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
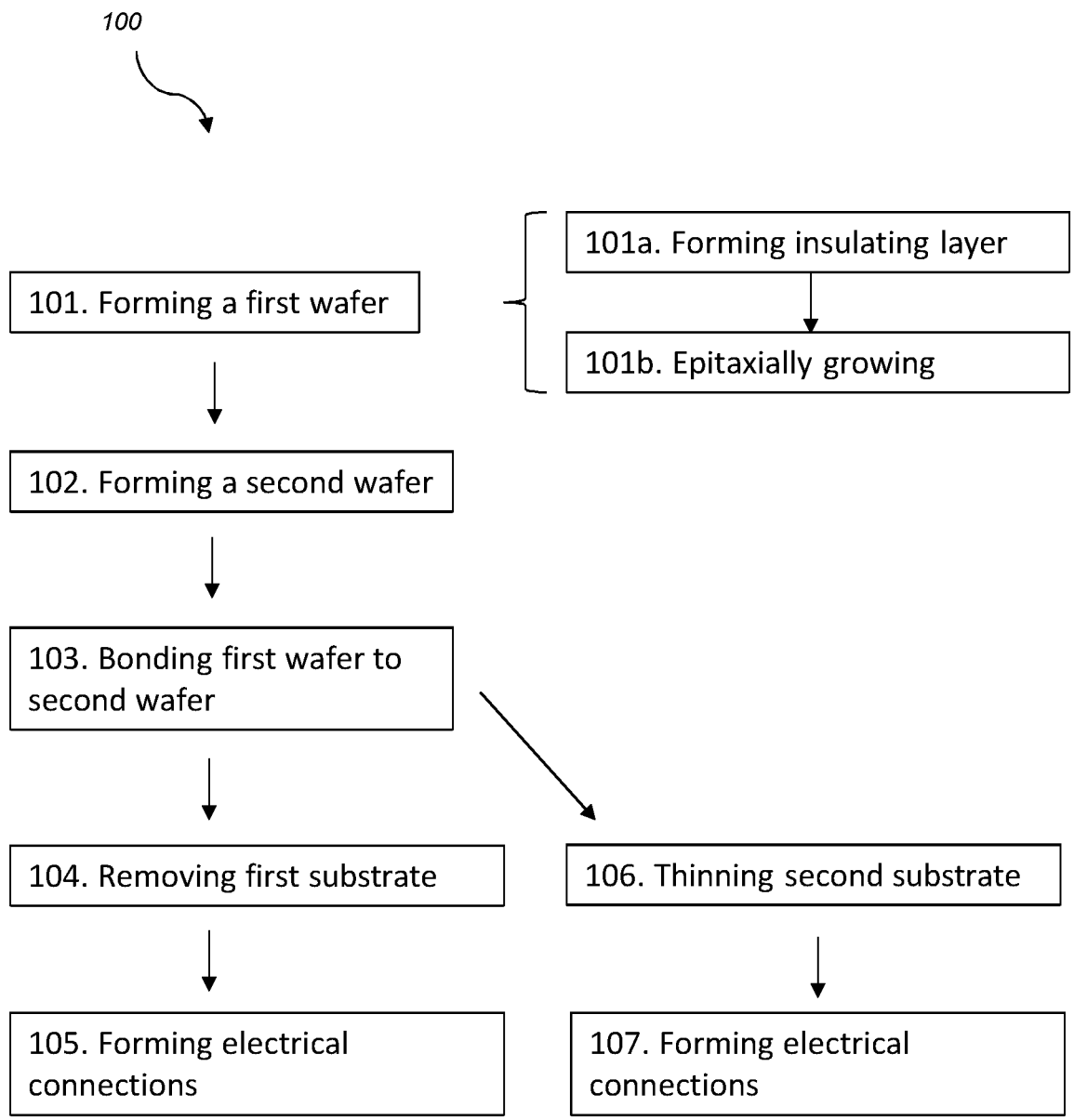
FIG. 1 is an illustration of the process steps of a method of the present disclosure

FIG. 1 shows a general overview of the process steps of the method 100 of the present disclosure for providing a semiconductor device.

The method 100 comprises a step 101 of forming (101) a first wafer (10) comprising a first substrate 11 of a group IV semiconductor, such as silicon, and a group III-V semiconductor device structure 12 formed by selective area epitaxial growth on a surface portion 13a of a front side 13 of the first substrate 11. Step 101 may for example comprise the steps of forming 101a an insulating layer 15 on the front side 13 of the first substrate 11. The surface portion 13a of the first substrate 11 may be exposed by a trench 16 in the insulating layer 15. Step 101 may also comprise epitaxially growing 101b the group III-V semiconductor device structure 12 on the surface portion 13a exposed by the trench 16.

The method 100 also comprises a step 102 of forming a second wafer 20 comprising a second substrate 21 of a group IV semiconductor, such as silicon, and a group IV semiconductor device structure 22 formed on a front side 23 of the second substrate 21. The semiconductor structure may be configured such that the second wafer is an active wafer. The semiconductor structure may for example comprise CMOS based sensor and/or read-out circuit.

Moreover, the method 100 comprises bonding 103 the first wafer 10 to the second wafer 20 with the front side 13 of the first substrate 11 facing the front side 23 of the second wafer 21. The bonding 103 may comprise full wafer-to-wafer bonding.

Thereafter, the method may comprise a step 104 of removing 104 the first substrate 11 to expose a base portion 17a of the group III-V semiconductor structure and a step of forming 105 electrical connections to said base portions 17a. Steps 104 and 105 may for example be relevant when the semiconductor device is a photo sensor and e.g. when the second wafer 20 comprises a CMOS sensor and/or read out circuitry.

Alternatively, or as a compliment, the method may after the step 103 of bonding the first wafer 10 to the second wafer 20 comprise a step of thinning 106 of the second substrate 21 and forming 107 electrical connections to said group IV semiconductor device structure 22. Steps 104 and 105 may for example be relevant when the second wafer 20 comprises a CMOS sensor and/or read out circuitry.

Figure 2A:
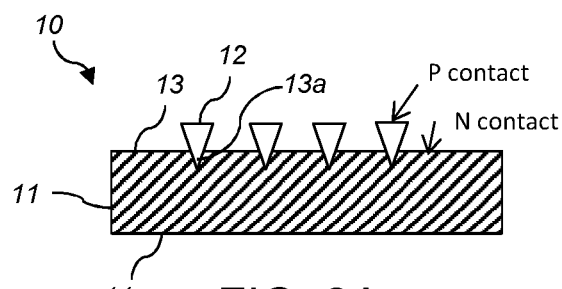
FIGS. 2a-f is an illustration of an embodiment of the method of the present invention for forming an imaging device.
Figure 2B:
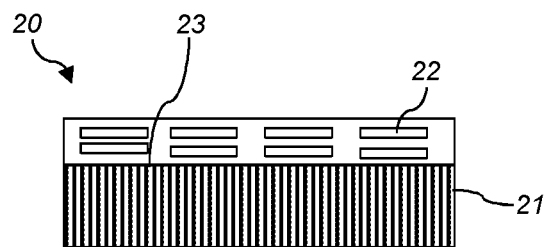
Figure 2C:
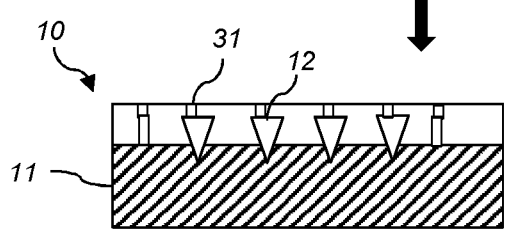
Figure 2D:
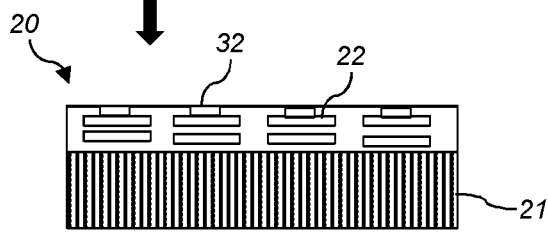

FIGS. 2a-f shows a schematic embodiment of a process architecture for preparing a semiconductor device in the form of a combined SWIR imager and imager for visible light (VIS). A first wafer 10 is formed by epitaxially growing at least one group III-V material on the front side 13a of a first silicon substrate 11 to form PIN diodes 12 on the silicon substrate (FIG. 2a). These diodes 12 may have a height of 0.5-4 μm and may be grown on a surface portions 13a that are in the form of trenches on the front side 13 of the silicon substrate 11. Further, a second wafer 20 is of a silicon substrate 21 is formed having a group IV semiconductor device structure 22 in the form of VIS sensor/CMOS on a front side 23 of the substrate 21 (FIG. 2b). The visible sensor/CMOS may be for back illumination.

Contacts 31 to the PIN diodes 12 on the first wafer 10 (FIG. 2c) and electrical contacts 32 to the CMOS structure 22 on the second wafer 20 (FIG. 2d) may then be formed. Both the first substrate 11 and the second substrate 21 may then be planarized and prepared for hybrid bonding using Cu/Ox and Cu/SiC. Planarization may be performed using techniques known in the art, i.e. using a mechanical polishing to flatten the surface.

Figure 2E:
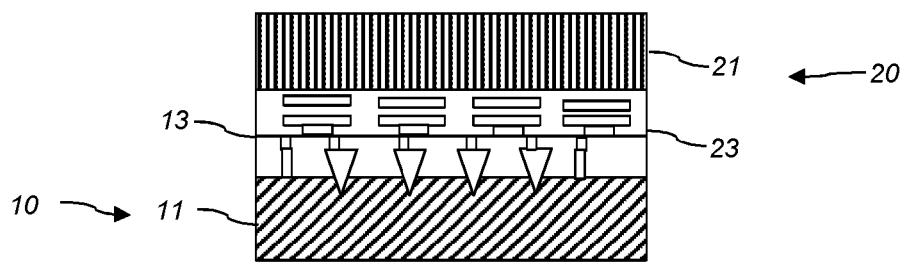
Figure 2F:
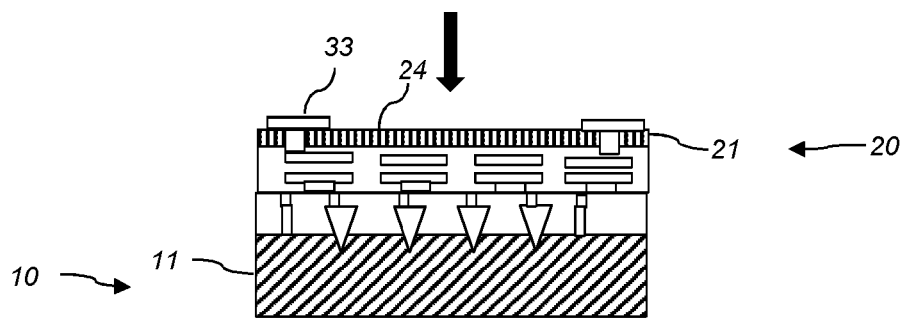

As illustrated in FIG. 2e, the first wafer 10 and the second wafer 20 are bonded using hybrid bonding such that the front side 13 of the first substrate 11 faces the front side 23 of the second wafer 21. Then, the back side 24 of the second substrate 21 is thinned and electrical connections 33 are formed to the VIS sensor 22 of the second wafer 20 to prepare the back illuminated VIS sensor and SWIR imager (FIG. 2f).

Figure 3A:
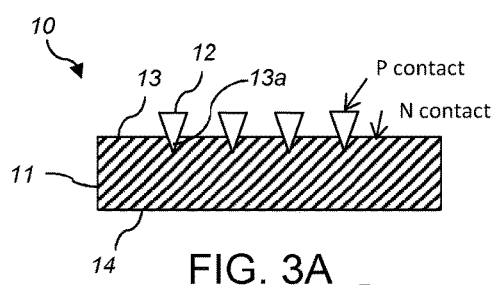
FIGS. 3a-g is an illustration of another embodiment of method of the present invention for forming an imaging device.
Figure 3B:
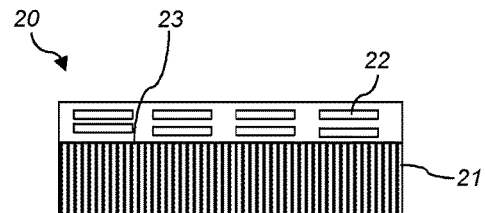
Figure 3C:
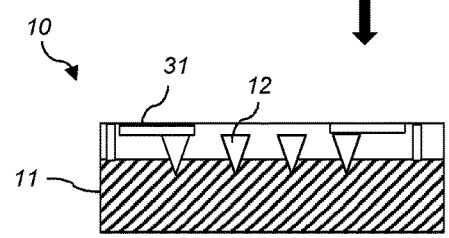
Figure 3D:
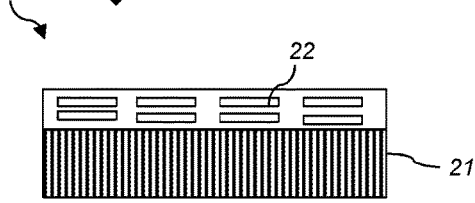

FIGS. 3a-f shows a schematic embodiment of an alternative process architecture for preparing a semiconductor device in the form of a combined SWIR imager and imager for visible light (VIS). A first wafer 10 is formed by epitaxially growing at least one group III-V material on the front side 13a of a first silicon substrate 11 to form PIN diodes 12 on the silicon substrate (FIG. 3a). These diodes 12 may have a height of 0.5-4 μm and may be grown on a surface portions 13a that are in the form of trenches on the front side 13 of the silicon substrate 11. Further, a second wafer 20 is of a silicon substrate 21 is formed having a group IV semiconductor device structure 22 in the form of VIS sensor/CMOS on a front side 23 of the substrate 21 (FIG. 3b). The visible sensor/CMOS may be for back illumination.

Figure 3E:
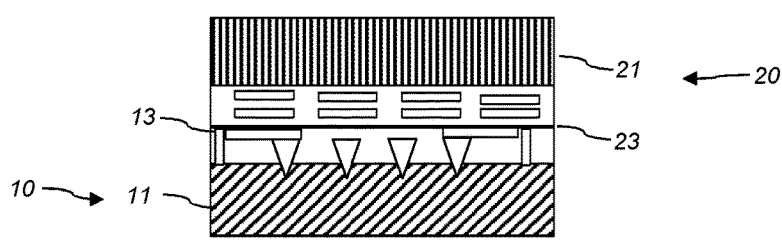
Figure 3F:
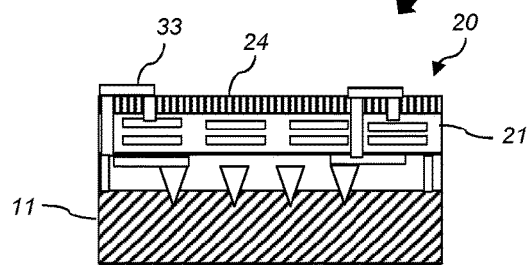
Figure 3G:
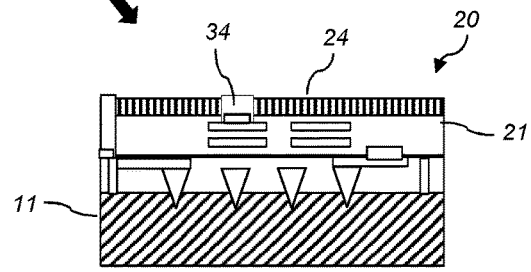

Contacts 31 to the PIN diodes 12 on the first wafer 10 may then be formed (FIGS. 3c and 3d), thereby forming a SWIR focal plane. Both the first substrate 11 and the second substrate 21 may be planarized and prepared for hybrid bonding using Cu/Ox and Cu/SiC. As illustrated in FIG. 3e, the first wafer 10 and the second wafer 20 are bonded using direct bonding such that the front side 13 of the first substrate 11 faces the front side 23 of the second wafer 21. Then, the back side 24 of the second substrate 21 is thinned and electrical connections 33 are formed to the VIS sensor 22 of the second wafer 20 to prepare the back illuminated VIS sensor and SWIR imager (FIG. 3f). As an alternative, the back side 24 of the second substrate 21 may thinned and cavity pads 34 may be formed (FIG. 3g).

Figure 4A:
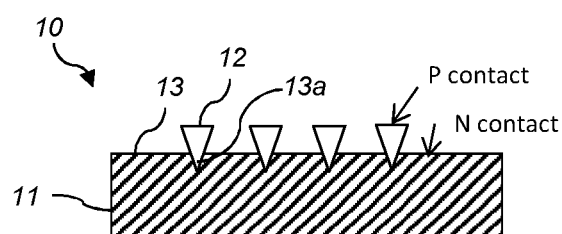
FIGS. 4a-f is an illustration of an embodiment of the method of the present invention for forming a front illuminated sensor.
Figure 4B:
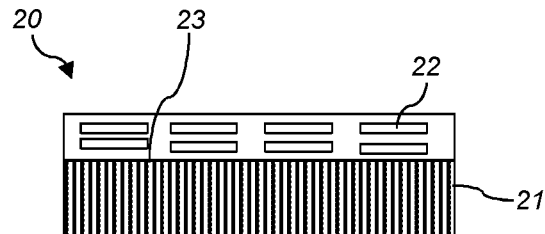
Figure 4C:
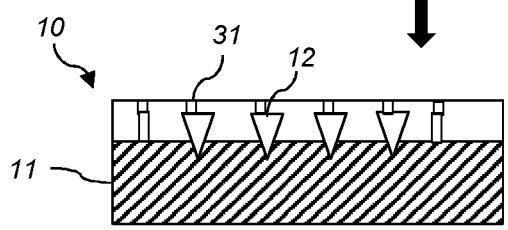
Figure 4D:
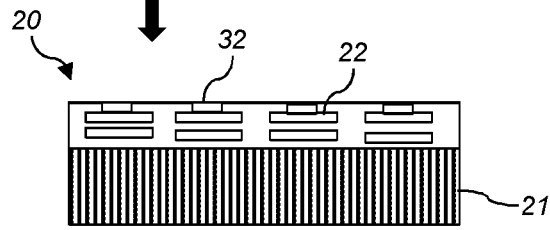

FIGS. 4a-f shows a schematic embodiment of a process architecture for preparing a semiconductor device in the form of a front illuminated sensor. A first wafer 10 is formed by epitaxially growing at least one group III-V material on the front side 13a of a first silicon substrate 11 to form PIN diodes 12 on the silicon substrate (FIG. 4a). These diodes 12 may have a height of 0.5-4 μm and may be grown on a surface portions 13a that are in the form of trenches on the front side 13 of the silicon substrate 11. Further, a second wafer 20 is of a silicon substrate 21 is formed having a group IV semiconductor device structure 22 in the form of a visible sensor (FSI)/CMOS ROIC on a front side 23 of the substrate 21 (FIG. 4b).

Figure 4E:
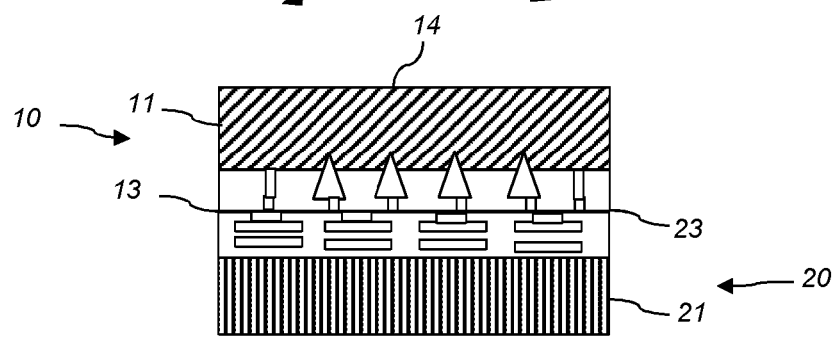
Figure 4F:
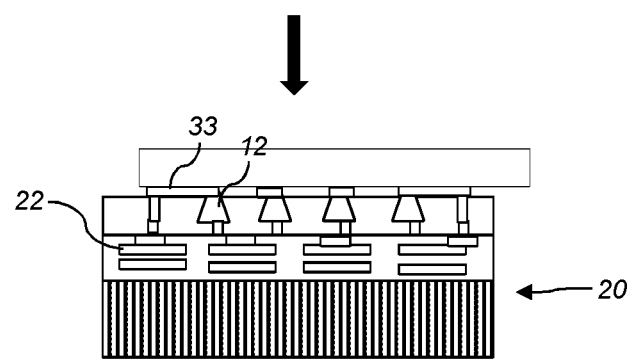

Contacts 31 to the PIN diodes 12 on the first wafer 10 (FIG. 4c) and electrical contacts 32 to the CMOS structure 22 on the second wafer 20 (FIG. 4d) may then be formed. Both the first substrate 11 and the second substrate 21 may be planarized and prepared for hybrid bonding using Cu/Ox and Cu/SiC. As illustrated in FIG. 4e, the first wafer 10 and the second wafer 20 are bonded using hybrid bonding such that the front side 13 of the first substrate 11 faces the front side 23 of the second wafer 21. Then, the back side 14 of the first substrate 11 is removed and electrical connections 33 are formed to the PIN diodes 12 and the second semiconductor structure 22 to prepare the CMOS/FSI imager made on silicon (FIG. 4f).

Figure 5A:
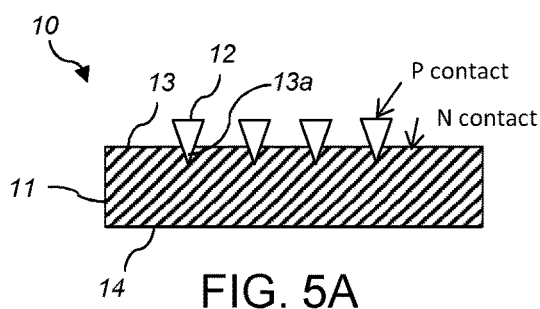
FIGS. 5a-f is an illustration of another embodiment of the method of the present invention for forming a front illuminated sensor, and 5g shows an alternative to 5f.
Figure 5B:
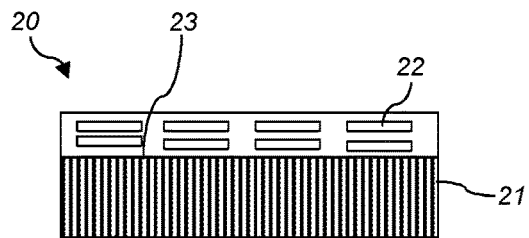

FIGS. 5a-f shows a schematic embodiment of an alternative process architecture for preparing semiconductor device in the form of a front illuminated sensor. A first wafer 10 is formed by epitaxially growing at least one group III-V material on the front side 13a of a first silicon substrate 11 to form PIN diodes 12 on the silicon substrate (FIG. 5a). These diodes 12 may have a height of 0.5-4 μm and may be grown on a surface portions 13a that are in the form of trenches on the front side 13 of the silicon substrate 11. Further, a second wafer 20 is of a silicon substrate 21 is formed having a group IV semiconductor device structure 22 in the form of a visible sensor (FSI)/CMOS ROIC on a front side 23 of the substrate 21 (FIG. 5b).

Figure 5C:
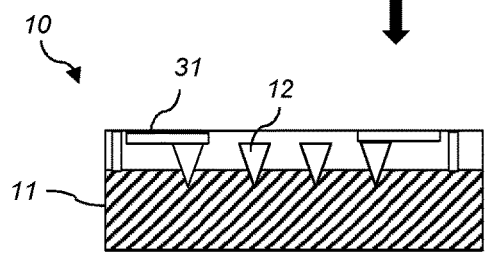
Figure 5D:
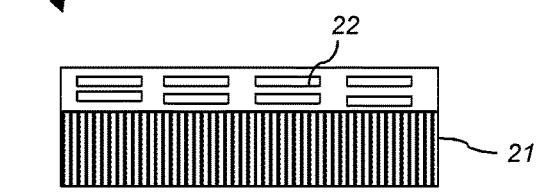
Figure 5E:
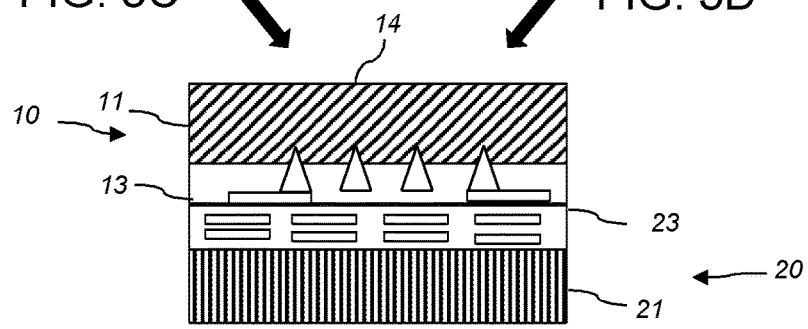
Figure 5F:
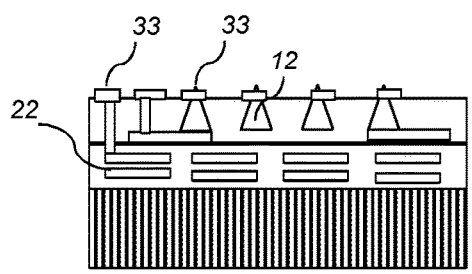
Figure 5G:
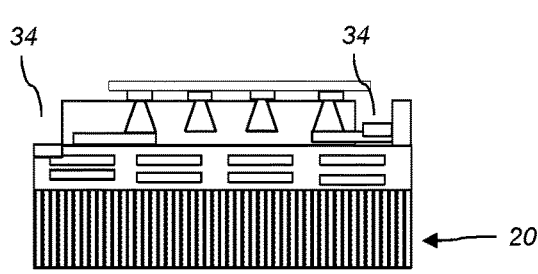

Contacts 31 to the PIN diodes 12 on the first wafer 10 may then be formed and the wafers 10 and 20 may then be prepared for wafer bonding (FIGS. 5c and 5d). Both the first substrate 11 and the second substrate 21 may be planarized and prepared for hybrid bonding using Cu/Ox and Cu/SiC. As illustrated in FIG. 5e, the first wafer 10 and the second wafer 20 are bonded using direct bonding such that the front side 13 of the first substrate 11 faces the front side 23 of the second wafer 21. Then, the back side 14 of the first substrate 11 is removed and electrical connections 33 are formed to the PIN diodes 12 and the second semiconductor structure 22 to form deep vias and N contacts (FIG. 5f). As an alternative, the back side 14 of the first substrate 11 is removed and cavity pads 34 and N contacts are formed, wherein the N contacts are interconnections vias (FIG. 5g).

Figure 6A:
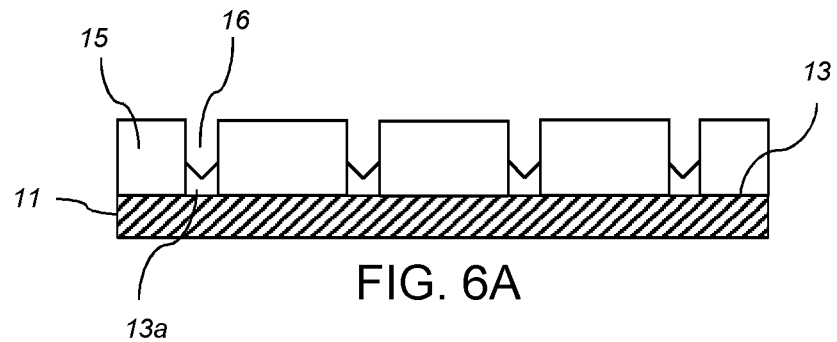
FIG. 6a-c is an illustration of the formation of a diode.
Figure 6B:
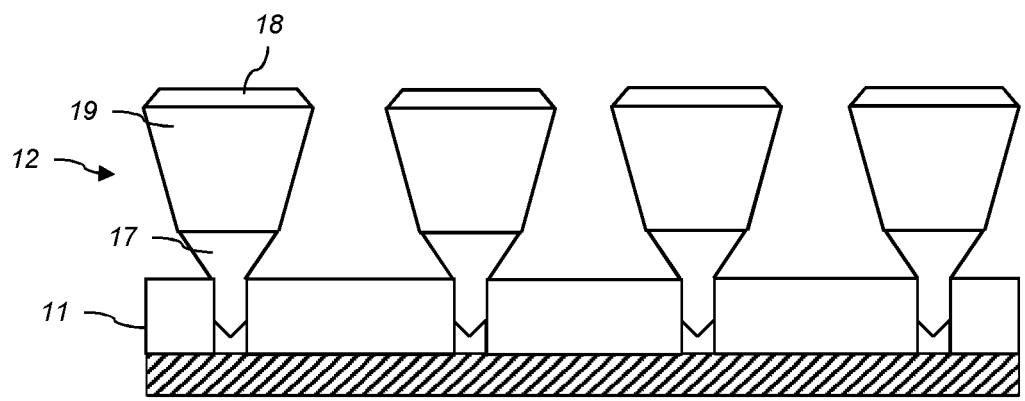
Figure 6C:
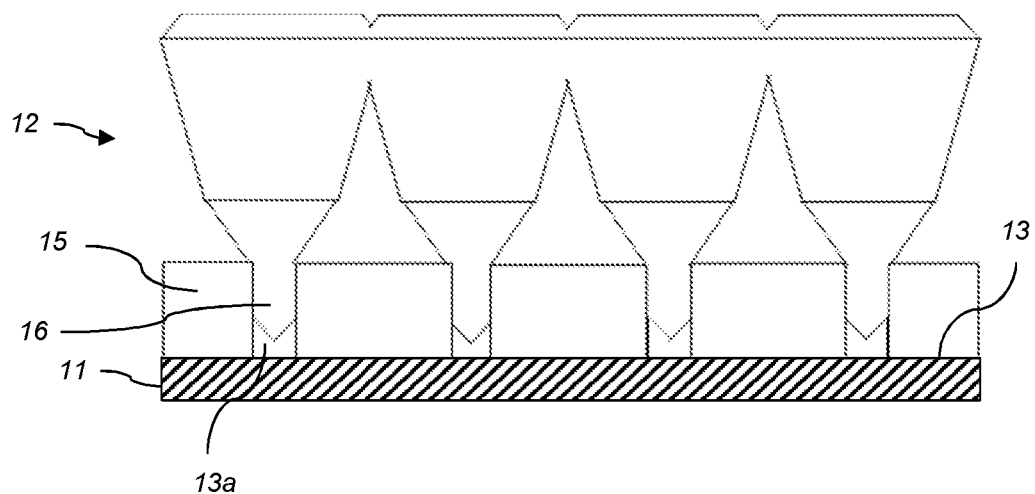

FIGS. 6a-c is a schematic illustration of an embodiment of the selective area epitaxial growth of a group III-V semiconductor device structure 2 in trenches 16 of a front side 13 of a first substrate 11, such as silicon. As illustrated in FIG. 6a, trenches 16 may be formed in an insulating layer 15 so as to expose a surface portion 13a of the first substrate 11. The surface portion 13a at the bottom of the trench may have a cross-section perpendicular to the length of the trench in the form of an inverted pyramid. The trenches 16 may for example have a width that is between 60-100 nm, such as between 70-90 nm.

The group III-V semiconductor device structure 12, such as a photodiode structure, may then be grown on the surface portion 13a exposed by the trench 16 using selective area epitaxial growth, such as aspect-ratio-tracking (ART), so as to form e.g. a diode structure 12, as illustrated in FIG. 6b. The method of forming the group III-V semiconductor device structure may comprise growing a lower narrow portion 17 in the trench 16 and an upper wider portion 18 protruding above the trench 16, as illustrated in the FIG. 6b. The photodiode structure 12 may further comprise an intrinsic portion 19 between the lower 17 and upper 18 diode portions. Further, the lower diode portion 17 may be of a first conductive type extending from the surface portion 13a and protruding above the trench 16, whereas the upper diode portion 18 may be of a second conductivity type opposite to the first conductivity type.

As illustrated in FIG. 6c, the distance between the trenches 16 and/or the epitaxial growth may be performed so that the semiconductor structures 12 merge above the trenches 16. Thus, the embodiment illustrated in FIG. 6c may be for forming a set of group III-V semiconductor photodiode structures 12 on a silicon wafer 11, wherein each photodiode structure 12 is formed by selective area growth on respective surface portions 13a of the front side 13 of the first substrate 11 exposed by a respective trench 16 in an insulating layer 15 formed on the front side 13 of the first substrate 11. Further, each photodiode structure 12 may comprise a lower diode portion 17 of a first conductive type extending from the respective surface portion 13a and protruding above the trench 16, and an upper diode portion 18 of a second conductivity type opposite to the first conductivity type, and the photodiode structures 12 are formed to merge above the trenches 16.

The epitaxial layers of the semiconductor structures grown on the first substrate 11 may for example be $In_xGa_{1-x}$As ($0 \leq x \leq 100$) and/or $In_xGa_{1-x}$Sb ($0 \leq x \leq 100$).

Further, the lower diode portion 17 could be a n+(p+)-Layer, the intrinsic portion 19 could be a n⁻(p⁻)-Layer, and the upper diode portion 18 could be a p+(n+)-Layer. Also, an insulating layer (not shown) could be deposited after growth of the diodes and contacts to the diodes 12 could be formed from Mo/Al, Ti/TiN, Ti/TiW, Ti/Al, Ti/TiN/Al, Ni/Ti or Pt/Ti/Au. Thus, the diodes could be embedded into a dielectric and planarized for further post processing and wafer bonding. The diodes 12 could also undego tapering (texturing) for increasing the absorbing volume of the semiconductor device 12. This may include enhancing the diode to increase absorption, since incident light may be bent more to a horizontal direction and thus remain in the material as compared to passing through more vertically.

Experimental Example—Preparation of a Vertical GAAs Diodes Grown Directly on 300 mm Si (001) Substrate Using ART Technique Methods The device fabrication process started with the preparation of patterned Si substrates. First, rectangular trenches were realized in 300 nm thick $SiO_2$ layer on a 300 mm Si (001) substrate using a standard shallow trench isolation (STI) process flow. Then the Si surface inside of the trenches were wet-etched with tetramethylammonium hydroxide (TMAH) to form V-shape {111} facets. These facets are suitable for the anti-phase domain free nucleation of III/V material directly on Si. After that the epitaxial growth of GaAs stack was performed by metal-organic chemical vapour phase deposition (MOCVD) method. The details of epitaxial growth and structural properties can be found in the publications Kunert et al, Appl. Phys. Let. 109, 091101 (2016) and Kunert et al, ECS Trans. (2016) 409-419.

The epitaxy resulted in the growth of so-called nano ridge (NR) vertical diodes The epitaxial process started with the growth of ~200 nm Si doped n-GaAs on phosphorus doped Si substrate. After that ~400 nm of unintentionally doped GaAs with a p– background was grown, followed by ~100 nm of the C-doped p-GaAs. The growth process was finalized by the growth of ~20 nm GaInP, lattice matched unintentionally doped in-situ surface passivation layer all around device perimeter.

The device fabrication comprised deposition of the $Al_2O_3$ ex-situ passivation layer using atomic layer deposition (ALD) all around device perimeter. After that, a thick $SiO_2$ planarization layer was deposited using plasma enhanced atomic layer deposition (PEALD) and high-aspect-ratio process (HARP) atmospheric CVD, followed by the chemical mechanical polishing (CMP) step. For the fabrication of electrical contacts, a combination of the wet etching and sputtering of Mo/Al or Ti/TiN/Al were used. The devices were biased using contacts to the top p-GaAs layer and n-Si substrate. The contact to the GaAs is 100 μm in diameter, thus contacting ~110 devices simultaneously on average. The leakage current measurements were performed on wafer level in the dark enclosure and controlled temperature.

Results

Figure 7A:
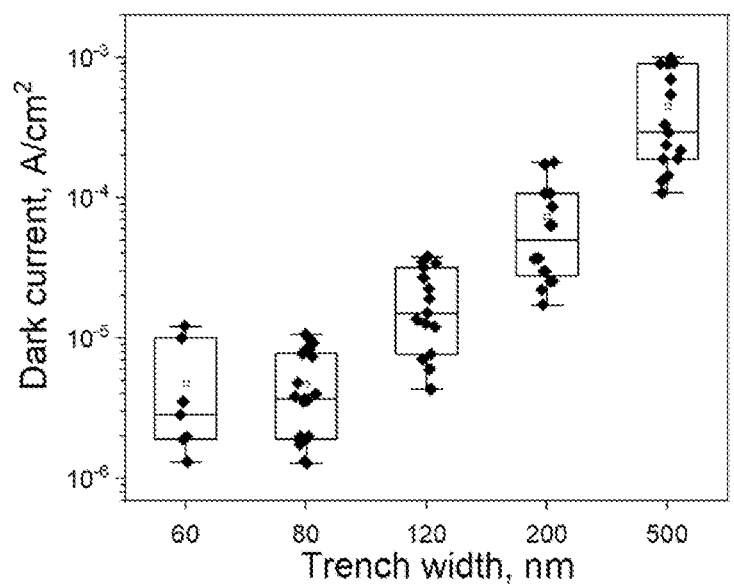
FIGS. 7a and 7b show experimental results of the dark current measured of GaAs pin diodes as function of trench width at −1V (FIG. 6a) and normal ambience (FIG. 6b).
Figure 7B:
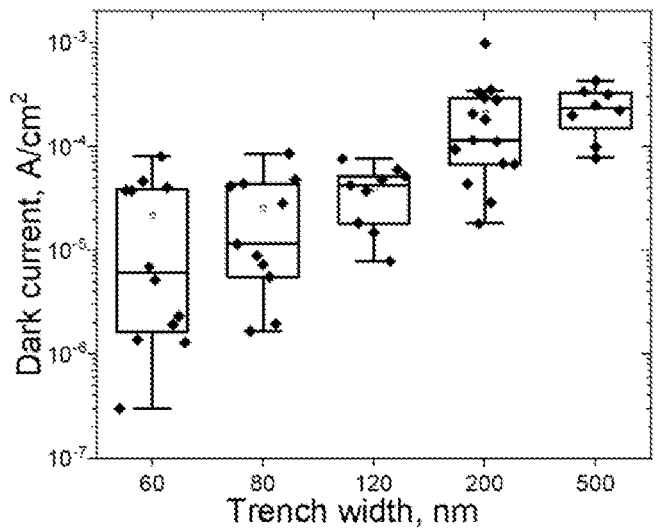

The dark current may be impacted by many physical parameters, e.g., temperature, bias, stress, defects, etc. Defects, such as threading dislocations, are well known contributors to the leakage current of a diode. In the ART device growth method of the present disclosure, the threading dislocations density (TDD) could be controlled by the proper choice of the epitaxial parameters, as well as, device geometry. The trench width was found to be an important geometrical parameter, as it allows control over defect density in the active region. With the purpose of TDD optimization, a set of diodes grown in the trenches of different width were fabricated. FIG. 7a and FIG. 7b show the leakage current measured on these pin-diodes. As one can see, the dark current is strongly impacted by the choice of the trench width. The diodes grown in the wider trenches show higher dark current, while diodes grown in the narrower trenches show lower dark current. The reduction of dark current scales well with the reduction of the threading dislocations density as function of trench width.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method comprising:
    forming a first wafer comprising a first substrate of a group IV semiconductor, and a group III-V semiconductor device structure formed by selective area epitaxial growth on a surface portion of a front side of the first substrate,
    forming a second wafer comprising a second substrate of a group IV semiconductor, and a group IV semiconductor device structure formed on a front side of the second substrate, and
    bonding the first wafer to the second wafer with the front side of the first substrate facing the front side of the second wafer,
    wherein forming the first wafer comprises:
    forming an insulating layer on the front side of the first substrate, the surface portion of the first substrate being exposed by a trench in the insulating layer, and
    thereafter epitaxially growing the group III-V semiconductor device structure on the surface portion exposed by the trench, and
    wherein forming the group III-V semiconductor device structure comprises growing a lower narrow portion in the trench and an upper wider portion protruding above the trench.

2. A method according to claim 1, wherein the first substrate is a silicon substrate and/or the second substrate is a silicon substrate.

3. A method according to claim 1, wherein the group III-V semiconductor device structure forms a photodiode structure comprising a lower diode portion of a first conductive type extending from the surface portion and protruding above the trench, and an upper diode portion of a second conductivity type opposite to the first conductivity type.

4. A method according to claim 3, wherein the photodiode structure further comprises an intrinsic portion between the lower and upper diode portions.

5. A method according to claim 1, wherein the width of at least one trench in the insulating layer is between 60-100 nm.

6. A method according to claim 1, wherein the first wafer comprises a set of group III-V semiconductor photodiode structures,
    each photodiode structure formed by selective area growth on respective surface portions of the front side of the first substrate exposed by a respective trench in an insulating layer formed on the front side of the first substrate, and
    each photodiode structure comprising a lower diode portion of a first conductive type extending from the respective surface portion and protruding above the trench, and an upper diode portion of a second conductivity type opposite to the first conductivity type, and
    wherein the photodiode structures are formed to merge above the trenches.

7. A method according to claim 1, wherein the bonding of the first wafer to the second wafer with the front side of the first substrate facing the front side of the second wafer is performed without any additional patterning of the front side of the first substrate after selective area epitaxial growth on a surface portion of a front side of the first substrate.

8. A method according to claim 1, wherein the group IV semiconductor device structure formed on a front side of the second substrate is configured such that the second substrate is an active substrate.

9. A method according claim 1, further comprising, subsequent to said bonding, removing the first substrate to expose a base portion of the group III-V semiconductor structure and forming electrical connections to said base portions.

10. A method according to claim 1, further comprising, subsequent to said bonding, thinning of said second substrate and forming electrical connections to said group IV semiconductor device structure.

11. A method comprising:
    forming a first wafer comprising a first substrate of a group IV semiconductor, and a group III-V semiconductor device structure formed by selective area epitaxial growth on a surface portion of a front side of the first substrate,
    forming a second wafer comprising a second substrate of a group IV semiconductor, and a group IV semiconductor device structure formed on a front side of the second substrate, and
    bonding the first wafer to the second wafer with the front side of the first substrate facing the front side of the second wafer,
    wherein the first wafer comprises a set of group III-V semiconductor photodiode structures,
    each photodiode structure formed by selective area growth on respective surface portions of the front side of the first substrate exposed by a respective trench in an insulating layer formed on the front side of the first substrate, and
    each photodiode structure comprising a lower diode portion of a first conductive type extending from the respective surface portion and protruding above the trench, and an upper diode portion of a second conductivity type opposite to the first conductivity type, and
    wherein the photodiode structures are formed to merge above the trenches.

* * * * *